United States Patent
Lee et al.

(10) Patent No.: US 9,972,773 B1
(45) Date of Patent: May 15, 2018

(54) METHOD AND SYSTEM FOR PROVIDING MAGNETIC JUNCTIONS UTILIZING HIGH CRYSTALLIZATION TEMPERATURE-CONTAINING INSERTION LAYER(S)

(71) Applicant: Samsung Electronics Co., LTD., Gyeonggi-do (KR)

(72) Inventors: Don Koun Lee, San Jose, CA (US); Mohamad Towfik Krounbi, San Jose, CA (US)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days. days.

(21) Appl. No.: 15/787,598

(22) Filed: Oct. 18, 2017

Related U.S. Application Data

(60) Provisional application No. 62/551,178, filed on Aug. 28, 2017.

(51) Int. Cl.

| | |
|---|---|
| H01L 27/22 | (2006.01) |
| H01L 43/08 | (2006.01) |
| H01L 43/02 | (2006.01) |
| G11C 11/16 | (2006.01) |
| H01L 43/12 | (2006.01) |
| H01L 43/10 | (2006.01) |

(52) U.S. Cl.
CPC ............ *H01L 43/08* (2013.01); *G11C 11/161* (2013.01); *H01L 27/222* (2013.01); *H01L 43/02* (2013.01); *H01L 43/10* (2013.01); *H01L 43/12* (2013.01)

(58) Field of Classification Search
CPC ......... H01L 43/08; H01L 43/12; H01L 43/10; H01L 27/222; H01L 43/02; G11C 11/161
See application file for complete search history.

(56) References Cited

U.S. PATENT DOCUMENTS

| | | | |
|---|---|---|---|
| 9,082,951 B2 | 7/2015 | Gan et al. | |
| 9,178,135 B2 | 11/2015 | Kim et al. | |
| 9,479,730 B1 | 10/2016 | Noll | |
| 9,508,924 B2 | 11/2016 | Tang et al. | |
| 9,818,931 B2* | 11/2017 | Tang ....................... | H01L 43/02 |
| 2014/0264671 A1* | 9/2014 | Chepulskyy ............ | H01L 43/08 257/421 |
| 2015/0129996 A1* | 5/2015 | Tang ....................... | H01L 43/12 257/427 |

(Continued)

*Primary Examiner* — Victor A Mandala
(74) *Attorney, Agent, or Firm* — Convergent Law Group LLP

(57) ABSTRACT

A magnetic junction, a memory using the magnetic junction and method for providing the magnetic junction are described. The magnetic junction includes a pinned layer, a perpendicular enhancement layer (PEL), an insertion layer between the pinned layer and PEL, a free layer and a nonmagnetic spacer layer between the PEL and free layer. The insertion layer includes at least one magnetic material and at least one high crystallization temperature nonmagnetic material. The PEL is between the insertion layer and the nonmagnetic spacer layer. The free layer is switchable between a plurality of stable magnetic states when a write current is passed through the magnetic junction. The PEL and free and pinned layers each has a perpendicular magnetic anisotropy energy greater than its out-of-plane demagnetization energy.

20 Claims, 7 Drawing Sheets

(56) References Cited

U.S. PATENT DOCUMENTS

| | | | |
|---|---|---|---|
| 2015/0129997 A1* | 5/2015 | Tang | H01L 43/12 257/427 |
| 2015/0162378 A1* | 6/2015 | Carey | H01L 43/02 257/421 |
| 2016/0005791 A1* | 1/2016 | Tang | H01L 43/08 257/427 |
| 2016/0005956 A1* | 1/2016 | Tang | H01L 43/08 257/421 |
| 2016/0197265 A1* | 7/2016 | Tang | H01L 43/02 257/421 |
| 2017/0110651 A1 | 4/2017 | Park et al. | |
| 2017/0263859 A1* | 9/2017 | Tang | H01L 43/10 |

* cited by examiner

METHOD AND SYSTEM FOR PROVIDING MAGNETIC JUNCTIONS UTILIZING HIGH CRYSTALLIZATION TEMPERATURE-CONTAINING INSERTION LAYER(S)

CROSS-REFERENCE TO RELATED APPLICATIONS

This application claims the benefit of provisional Patent Application Ser. No. 62/551,178, filed Aug. 28, 2017, entitled HAFNIUM-CONTAINING BASE LAYER FOR A PERPENDICULAR ENHANCEMENT LAYER FOR PERPENDICULAR MAGNETIC JUNCTIONS, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, a conventional magnetic tunneling junction (MTJ) may be used in a conventional STT-MRAM. The conventional MTJ typically resides on a substrate. The MTJ, uses seed layer(s), may include capping layers and may include an antiferromagnetic (AFM) layer to fix the magnetization of the reference layer. The conventional MTJ includes a reference layer, a free layer and a tunneling barrier layer between the pinned and free layers. A bottom contact below the MTJ and a top contact on the MTJ may be used to drive current through the MTJ in a current-perpendicular-to-plane (CPP) direction. The reference layer and the free layer are magnetic. The magnetization of the reference layer is fixed, or pinned, in a particular direction. The free layer has a changeable magnetization. The free layer and reference layer may be a single layer or include multiple layers.

To switch the magnetization of the free layer, a current is driven in the CPP direction. When a sufficient current is driven from the top contact to the bottom contact, the magnetization of the free layer may switch to be parallel to the magnetization of a bottom reference layer. When a sufficient current is driven from the bottom contact to the top contact, the magnetization of the free layer may switch to be antiparallel to that of the bottom reference layer. The differences in magnetic configurations correspond to different magnetoresistances and thus different logical states (e.g. a logical "0" and a logical "1") of the conventional MTJ.

Because of their potential for use in a variety of applications, research in magnetic memories is ongoing. For example, a low switching current, sufficient thermal stability and high perpendicular magnetic anisotropy may be desired for improved write efficiency and data retention. These properties are desired to be present in the magnetic junctions in the final device. Accordingly, what is needed is a method and system that may improve the performance of spin transfer torque based memories and the electronic devices in which such memories are used. The method and system described herein address such a need.

BRIEF SUMMARY OF THE INVENTION

A magnetic junction, a memory using the magnetic junction and method for providing the magnetic junction are described. The magnetic junction includes a pinned layer, a perpendicular enhancement layer (PEL), an insertion layer between the pinned layer and PEL, a free layer and a nonmagnetic spacer layer between the PEL and free layer. The insertion layer includes at least one magnetic material and at least one high crystallization temperature nonmagnetic material such as Hf. The magnetic material may include at least one Co layer. One of the Co layers might be deposited at substrate temperatures greater than room temperature. The pinned layer may include at least one of Pt and Ir. The at least one magnetic material may include Co. The PEL is between the insertion layer and the nonmagnetic spacer layer. The free layer is switchable between a plurality of stable magnetic states when a write current is passed through the magnetic junction. The PEL and free and pinned layers each has a perpendicular magnetic anisotropy energy greater than its out-of-plane demagnetization energy.

The magnetic junction may have improved resistance to degradation after high temperature anneals. More specifically, the pinned layer exchange field, back hopping rate and write error rate may be maintained at desired levels despite a high temperature anneal. As a result, performance may be improved.

DETAILED DESCRIPTION OF THE INVENTION

Figure 1A:
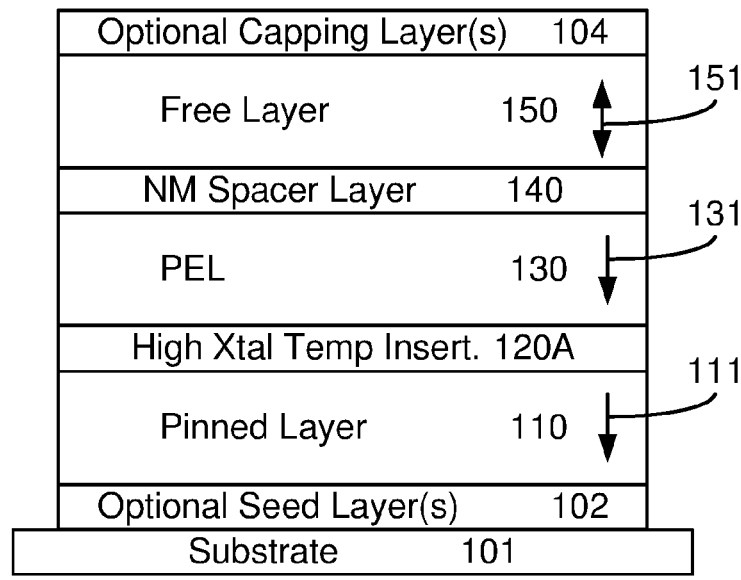
FIGS. 1A-1C depict exemplary embodiments of a magnetic junction usable in a magnetic memory, programmable using spin transfer torque and including at least one insertion layer including a high crystallization temperature constituent oxide layer.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction, a memory using the magnetic junction and method for providing the magnetic junction are described. The magnetic junction includes a pinned layer, a perpendicular enhancement layer (PEL), an insertion layer between the pinned layer and PEL, a free layer and a nonmagnetic spacer layer between the PEL and free layer. The insertion layer includes at least one magnetic material and at least one high crystallization temperature nonmagnetic material such as Hf. The magnetic material may include at least one Co layers. One of the Co layer(s) may be deposited at substrate temperatures greater than room temperature. The PEL is between the insertion layer and the nonmagnetic spacer layer. The free layer is switchable between a plurality of stable magnetic states when a write current is passed through the magnetic junction. The PEL and free and pinned layers each has a perpendicular magnetic anisotropy energy greater than its out-of-plane demagnetization energy.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. One of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. One of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction. The method and system are also described in the context of certain alloys. Unless otherwise specified, if specific concentrations of the alloy are not mentioned, any stoichiometry not inconsistent with the method and system may be used.

Figure 1B:
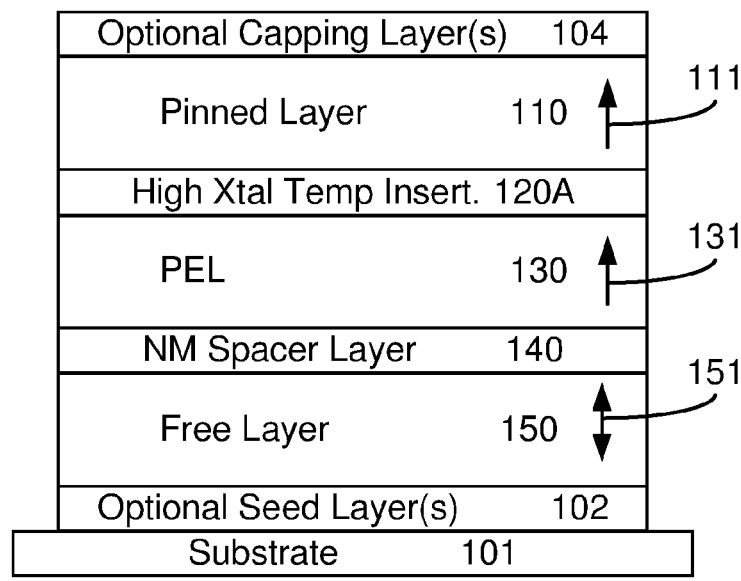
Figure 1C:
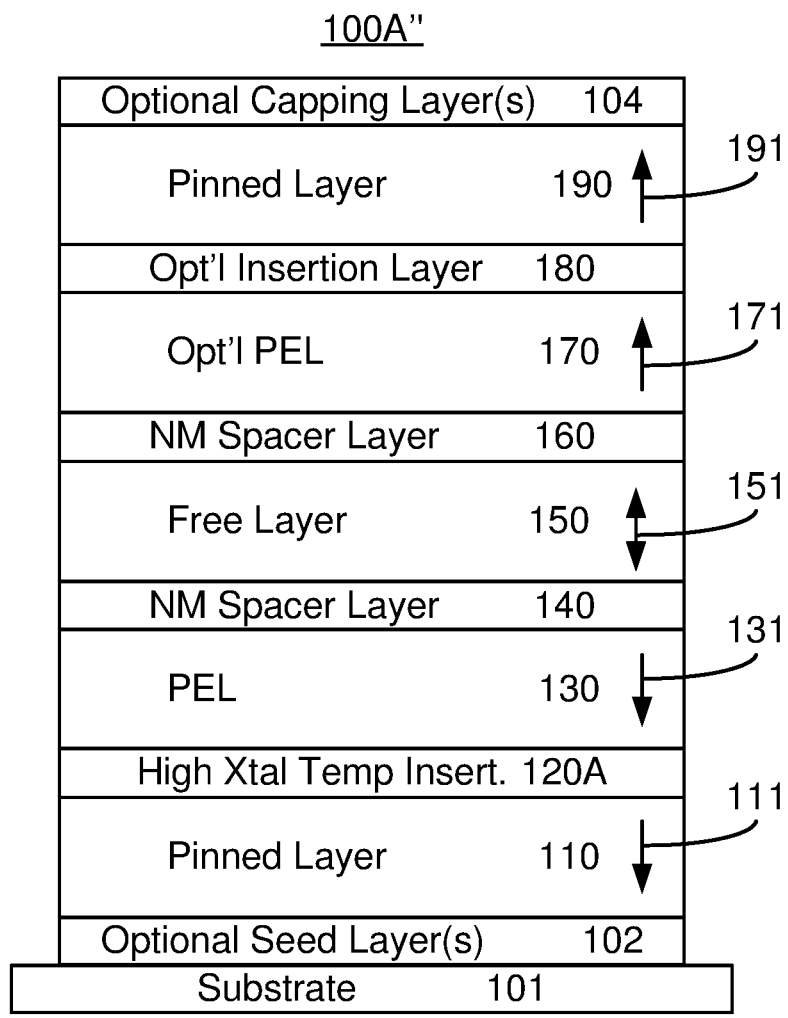

FIGS. 1A, 1B and 1C depict exemplary embodiments of a magnetic junction 100A, a magnetic junction 100A' and a magnetic junction 100A", respectively usable in a magnetic memory, programmable using spin transfer torque. For clarity, FIGS. 1A-1C are not to scale and not all components may be shown. The magnetic junctions 100A, 100A' and/or 100A" may be used in a magnetic device such as a spin transfer torque magnetic random access memory (STT-MRAM) and, therefore, in a variety of electronic devices.

Referring to FIG. 1A the magnetic junction 100A may include a pinned layer 110 having a magnetic moment 111, an insertion layer 120A, a perpendicular enhancement layer (PEL) 130, a nonmagnetic spacer layer 140 and a free layer 150 having magnetic moment 151. Also shown are optional seed layer(s) 102 and capping layer(s) 104. The substrate 101 on which the magnetic junction 100 is formed resides below the seed layers and is shown for clarity. A bottom contact and a top contact are not shown but may be formed. Other layers such as coupling layers and antiferromagnetic (AFM) or other layers and/or other layers may be present. However, such layers are not shown for simplicity. As can be seen in FIG. 1A, the magnetic junction 100A has its pinned layer 110 closest to the substrate 101. The magnetic junction 100A is a bottom pinned magnetic junction.

The free layer 150 may have a high perpendicular magnetic anisotropy (PMA). Thus, the free layer 150 has a PMA energy greater than a free layer out-of-plane demagnetization energy. Thus, the moment 151 is stable perpendicular-to-plane. As can be inferred from the double-headed arrow, the free layer magnetic moment 151 may be stable when pointed toward the top of the page and when pointed toward the bottom of the page in FIG. 1A. In alternate embodiments, the magnetic moment 151 may be stable in-plane. The free layer 150 is depicted as a single layer. However, in other embodiments, the free layer 150 may be a multilayer. For example, the free layer 150 might be a synthetic antiferromagnet including multiple ferromagnetic layers interleaved with and sandwiching one or more nonmagnetic layers. For example, the free layer 150 might include two ferromagnetic layers separated by a nonmagnetic layer, such as a Ru layer. The thickness of the Ru layer may be selected so that the ferromagnetic layers are antiferromagnetically coupled via a Ruderman-Kittel-Kasuya-Yosida (RKKY) coupling. Alternatively, the nonmagnetic layer thickness may be selected for ferromagnetic coupling. In other embodiments, the free layer 150 might be some other multilayer and/or may have layer(s) coupled in another manner. In some embodiments, the free layer may include or consist of an Fe layer, a $(CoFe)_{1-y}B_y$ layer and/or a $(CoFeNi)_{1-y}B_y$, layer where $0 \leq y < 1$. Other or additional alloys and/or multilayers may be used in other embodiments.

The free layer 150 has a changeable magnetic moment 151 and, therefore, may be used to store data. The magnetic junction 100A is also configured to allow the free layer magnetic moment 151 to be switched between stable magnetic states when a write current is passed through the magnetic junction 100A. Thus, the free layer 150 is switchable utilizing spin transfer torque when a write current is driven through the magnetic junction 100A in a current perpendicular-to-plane (CPP) direction. Depending upon the direction of the write current, towards the top or bottom of the page in FIG. 1A, the free layer 150 may be programmed to different states. The direction of the magnetic moment 151 of the free layer 150 may be read by driving a read current through the magnetic junction 100A. Such a read current is less than the write current and insufficient to switch the direction of the magnetic moment.

The nonmagnetic spacer layer 140 may be a tunneling barrier layer. For example, the nonmagnetic spacer 140 may be a crystalline MgO tunneling barrier with a (100) orientation. Such a nonmagnetic spacer layer 140 may not only enhance the tunneling magnetoresistance (TMR) of the magnetic junction 100A, but also increase the PMA of the free layer 150. A crystalline MgO tunneling barrier layer 1420 may have a thickness of at least eight Angstroms and not more than fifteen Angstroms. For example, a crystalline MgO tunneling barrier layer 140 may be nominally at least ten and not more than twelve Angstroms thick. However, other thicknesses may be possible. The nonmagnetic spacer layer 120 may also be considered to serve as a seed layer for the free layer 130. In an alternate embodiment, the nonmagnetic spacer layer 120 may have another structure including but not limited to being a conductive layer.

The pinned layer 110 and PEL 130 may act together as a reference layer for the magnetic junction 100A. The pinned layer 110 and the PEL 130 each has a PMA energy greater than the out-of-plane demagnetization energy. Thus, the magnetic moments 111 and 131 are stable perpendicular-to-plane. The pinned layer 110 is shown as being a single layer. However, in other embodiments, the pinned layer 110 may be a multilayer. For example, the pinned layer 110 might be a SAF as described above. In other embodiments, other multilayers may be used. For example, the pinned layer may include a Co—Pt layer and/or a Co—Ir layer. For example, the pinned layer 110 may be or include a Co/Pt multilayer. In such a multilayer, one or more repeats of a Co/Pt bilayer ([Co/Pt]n, with n≤1) may be used. In some embodiments, the pinned layer 110 may be or include a Co/Ir multilayer. Such a multilayer has one or more repeats of a Co/Ir bilayer ([Co/Ir]n, with n≤1). In some embodiments, one of the Co layers in the Co/Ir multilayer may be deposited at a high temperature (above three hundred degrees Celsius) and/or at a high power (above two hundred watts). In other embodiments, such a deposition may not be used. In some embodiments, the top layer of the Co/Pt and/or Co/Ir bilayer may be the nonmagnetic material. This is because, as discussed below, the insertion layer 120A may include Co, such as a Co alloy layer or a Co layer that shares an interface with the pinned layer 110. Alternatively, the top layer may be Co. Other pinned layer(s) having other structures and/or using other materials might be used in some embodiments. Optional pinning layer(s) (not shown) may be used to fix the magnetization of the pinned layer 110. In some embodiments, the optional pinning layer may be an AFM layer or multilayer that pins the magnetization(s) through an exchange-bias interaction. However, in other embodiments, the optional pinning layer may be omitted or another structure may be used. In the embodiment shown, the magnetic moment 111 of the pinned layer 110 is pinned by the magnetic anisotropy of the reference layer 110.

The PEL 130 has a high PMA. The PEL 130 thus may be used to enhance the perpendicular magnetic anisotropy of the layers 110, 120A and 130. In some embodiments, the PEL 130 includes B and at least one of Co and Fe. For example, the PEL 130 may include a $(CoFe)_{(1-x)}B_x$ layer and/or a $Fe_{(1-x)}B_x$ layer. In such embodiments, where $0.2 < x$. In some such embodiments, $x \leq 0.6$. Thus, the PEL 130 may have a high spin polarization. However, in alternate embodiments, other stoichiometries and/or other materials may be used. For example, in another embodiment, the PEL 130 may include $[(CoFe)_{(1-x)}B_x]_{(1-y)}Mo_y$ where $0 < x \leq 0.6$, $0 < y \leq 0.4$ and $0 < y \leq 1$.

Also shown is insertion layer 120A. The insertion layer 120A is between the pinned layer 110 and the PEL 130. The insertion layer 120A may adjoin the pinned layer 110 and the PEL. Thus, the insertion layer 120A may share an interface with the pinned layer 110. The insertion layer 120A includes a magnetic material and a high crystallization temperature nonmagnetic material. In some embodiments, the crystallization temperature (the temperature at which an amorphous as-deposited layer crystallizes) is at least four hundred and fifty degrees Celsius. The crystallization temperature may be at least five hundred degrees Celsius. The crystallization temperature of the high crystallization temperature nonmagnetic material might be higher. In some embodiments, the high crystallization temperature nonmagnetic material is Hf. In some embodiments, the magnetic material is Co. For ease of explanation, the high crystallization temperature nonmagnetic material is referred to hereinafter as Hf. Similarly, the magnetic material of is referred to hereinafter as Co. However, one of ordinary skill in the art will recognize that in other embodiments, other high crystallization temperature nonmagnetic material(s) and/or other magnetic materials might be used. Such changes may or may not affect performance of the magnetic junction 100A.

In at least a portion of the insertion layer 120A, the Co and Hf are intermixed. For example, if the insertion layer 120A includes layer(s) of Co and Hf, then at least near the interface(s) between the layers, Co and Hf may be intermixed. In some embodiments, this intermixing is provided by depositing at least the Hf at a high power. For some systems, a high power is greater than two hundred Watts. However, the system and method may employ other powers and/or mechanisms for obtaining intermixing of the Co and Hf (i.e. the magnetic material(s) and the nonmagnetic high crystallization temperature material(s)). In some embodiments, the thickness of the Hf layer is at least one Angstrom and not more than five Angstroms. In some such embodiments, the Hf layer is not more than four Angstroms thick. The Co layer may be at least five Angstroms thick and not more than ten Angstrom thick in some embodiments. In such embodiments, the Hf and Co may intermix at the interface between the layers. In some embodiments, this intermixed region may be approximately one monolayer (e.g. on the order of 1.5 Angstroms thick). In other embodiments, the intermixed region may be greater than one monolayer and less than three monolayers thick. Other thicknesses are possible. The Co layer may be deposited at room temperature or at higher temperature(s). For example, the Co layer may be deposited at temperatures not exceeding 600 C. The insertion layer 120A may be or include a Co—Hf alloy. In such an embodiment, the intermixing may be a result of the alloying of Co and Hf. Thus, the Hf may, but need not, be deposited at a high power. In such an embodiment, the thickness of the Co—Hf layer may be at least four Angstroms and not more than ten Angstroms. In such an embodiment, The $Co_xHf_{1-x}$, where x does not exceed 0.7.

The magnetic junction 100A having the insertion layer 120A may have improved performance, particularly if high temperature anneals are used in the fabrication process. The PEL 130 and pinned layer 110 are desired to be robust and magnetically stable. Thus, the PMA for each of the layers 110 and 130 is desired to be high in the final devices. As part of back end processing of a magnetic device, such as a magnetic memory, higher temperature anneals are desired. For example, semiconductor devices often undergo anneals at temperatures of up to four hundred degrees Celsius. In a conventional magnetic junction, a Ta insertion layer may be used in lieu of the insertion layer 120A. However, such a conventional magnetic junction suffers a significant decrease in the exchange field of the PEL 130 and an attendant decrease in the magnetic stability of the PEL 130 if the magnetic junction undergoes anneals of at least 400 degrees Celsius. Consequently, the write error rate (WER) and backhopping (BH) rate increase. In contrast, the insertion layer 120A includes a high crystallization temperature nonmagnetic material such as Hf as well as a magnetic material that may be intermixed. Because such an insertion layer 120A is present in the magnetic junction 100A, the magnetic junction 100A is better able to withstand higher temperature anneals. Characteristics such as the WER, BH rate and exchange field may be improved. In some embodiments, for example, the WER, BH rate and/or exchange field may not decrease by more than ten percent after anneal(s) of at least four hundred degrees Celsius. In some such embodiments, the WER, BH rate and/or exchange field may not decrease by more than five percent after anneal(s) of at least four hundred degrees Celsius. In some such embodiments, the WER, BH rate and/or exchange field may not decrease by more than five or ten percent after anneal(s) of at least four hundred fifty degrees Celsius. Consequently, processes used in fabrication of semiconductor devices may be used in manufacturing of an MRAM including the magnetic junction 100A substantially without adversely affecting performance of the magnetic junction 100A. The magnetic junction 100A may be more easily and better incorporated into an electronic device.

FIG. 1B depicts a magnetic junction 100A'. For clarity, FIG. 1B is not to scale and not all components may be shown. The magnetic junction 100A' is analogous to the magnetic junction 100A. Consequently, similar components have analogous labels. The magnetic junction 100A' includes pinned layer 110', insertion layer 120A, PEL 130, nonmagnetic spacer layer 140 and free layer 150 having magnetic moment 151 that are analogous to the pinned reference layer 110, insertion layer 120A, PEL 130, nonmagnetic spacer layer 140 and free layer 150, respectively. Optional seed layer 102 and capping layer 104 as well as the substrate 101 are also shown.

The structure, function and material(s) used for the layers 110, 120A, 130, 140 and 150 in the magnetic junction 100A' are analogous to those used in the magnetic junction 100A. For example, the insertion layer 120A includes a high crystallization temperature material such as Hf and a magnetic material such as Co. The Hf and Co may be at least partially intermixed, for example due to a high power deposition of at least the Hf. However, the relationship to the substrate for the layers 110, 120A, 130, 140 and 150 has been reversed. Thus, the magnetic junction 100A' is a top pinned magnetic junction.

The magnetic junction 100A' shares the benefits of the magnetic junction 100A. The magnetic junction 100A' has the insertion layer 120A that includes a high crystallization temperature nonmagnetic material and a magnetic material. Consequently, the magnetic junction 100A' may have improved performance despite the use of higher temperature anneals. For example, the exchange field and magnetic stability of the PEL 130 and pinned layer 110 may not degrade by more than five or ten percent despite anneal(s) of the magnetic junction 100A' at temperatures of up to four hundred degrees Celsius or up to four hundred and fifty degrees Celsius. The WER, BH rate and/or exchange field may be substantially preserved through the anneal(s). Thus, processes such as those used in semiconductor devices may be part of fabrication of a magnetic device, such as STT-MRAM, including the magnetic junction 100A'. Consequently, the magnetic junction 100A' may be more easily and better incorporated into an electronic device without its performance unduly adversely affected.

FIG. 1C depicts another exemplary embodiment of a magnetic junction 100A" in magnetic devices such as a magnetic memory programmable using spin transfer torque. For clarity, FIG. 1C is not to scale and not all components may be shown. The magnetic junction 100A" is analogous to the magnetic junctions 100A and/or 100A'. Consequently, similar components have analogous labels. The magnetic junction 100A" is a dual magnetic junction that includes pinned layer 110, insertion layer 120A, PEL 130, nonmagnetic spacer layer 140 and free layer 150 having magnetic moment 151 that are analogous to the pinned layer 110, insertion layer 120A, PEL 130, nonmagnetic spacer layer 140 and free layer 150 having magnetic moment 151 in FIGS. 1A and 1B. Optional seed layer 102 and capping layer 104 as well as the substrate 101 are also shown.

The structure, function and material(s) used for the pinned layer 110, insertion layer 120A, PEL 130, nonmagnetic spacer layer 140 and free layer 150 in the magnetic junction 100A" are analogous to those used for the reference layer 110, insertion layer 120A, PEL 130, nonmagnetic spacer layer 140 and free layer 150 in the magnetic junctions 100A and/or 100A'. For example, the insertion layer 120A includes a high crystallization temperature material such as Hf and a magnetic material such as Co. The Hf and Co may be at least partially intermixed, for example due to a high power deposition of at least the Hf.

The magnetic junction 100A" also includes an additional nonmagnetic spacer layer 160, an optional additional PEL 170, an optional insertion layer 180 and an additional reference layer 180 having magnetic moment 181. The nonmagnetic spacer layer 160 is analogous to the nonmagnetic spacer layer 140. For example, the nonmagnetic spacer layer 160 may be a crystalline MO tunneling barrier layer. The optional PEL 170, optional insertion layer 180 and pinned layer 190 are analogous to the layers 130, 120A and 110, respectively. However, in some embodiments, the optional insertion layer 180 may include or consist of Ta, W, Nb, Hf, Zr and/or Mo.

The magnetic junction 100A" is a dual magnetic junction. In the embodiment shown, the magnetic junction 100A" is in a dual state. A dual state occurs when the magnetic moment 171 is antiparallel to the magnetic moment 131. In the embodiment shown, the magnetic moments 191 and 111 are also antiparallel. Use of a dual magnetic junction 100A" in the dual state may allow for a smaller write current for spin transfer. If the dual magnetic junction 100A" is in the antidual state, a larger signal may be achieved. The magnetic junction 100A" may also share the benefits of the magnetic junctions 100A and/or 100A'. The magnetic junction 100A" having the insertion layer 120A may have improved performance despite the use of higher temperature anneals. For example, in some embodiments, the WER, BH rate and/or exchange field may not degrade by more than five or ten percent after anneal(s) at anneal temperatures of at least four hundred degrees Celsius or at least four hundred fifty degrees Celsius. Thus, processes such as those used in semiconductor devices may be part of fabrication of a magnetic device including the magnetic junction 100A". Consequently, the magnetic junction 100A" may be more easily and better incorporated into an electronic device without its performance unduly adversely affected.

Figure 2:
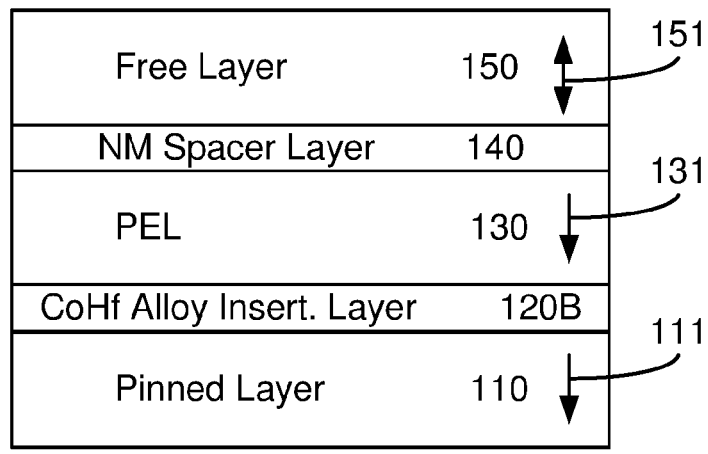
FIG. 2 depicts an exemplary embodiment of another magnetic junction usable in a magnetic memory, programmable using spin transfer torque and including at least one insertion layer including a high crystallization temperature constituent.

FIG. 2 depicts another exemplary embodiment of a magnetic junction 100B in magnetic devices such as a magnetic memory programmable using spin transfer torque. For clarity, FIG. 2 is not to scale and not all components may be shown. The magnetic junction 100B is analogous to the magnetic junctions 100A, 100A' and/or 100A". Consequently, similar components have analogous labels.

The magnetic junction 100B is a bottom pinned magnetic junction that includes pinned layer 110, insertion layer 120B, PEL 130, nonmagnetic spacer layer 140 and free layer 150 having magnetic moment 151 that are analogous to the pinned layer 110, insertion layer 120A, PEL 130, nonmagnetic spacer layer 140 and free layer 150 having magnetic moment 151 in FIGS. 1A-1C. Optional seed layer 102 and capping layer 104 as well as the substrate 101 are also shown.

The structure, function and material(s) used for the pinned layer 110, insertion layer 120B, PEL 130, nonmagnetic spacer layer 140 and free layer 150 in the magnetic junction 100B are analogous to those used for the reference layer 110, insertion layer 120A, PEL 130, nonmagnetic spacer layer 140 and free layer 150 in the magnetic junctions 100A, 100A' and/or 100A". For example, the insertion layer 120B includes a high crystallization temperature material such as Hf and a magnetic material such as Co. The Hf and Co may be at least partially intermixed, for example due to a high power deposition of at least the Hf. Similarly, the pinned layer 110 may include Pt and/or Ir, for example in the form of a Co/Pt multilayer and/or a Co/Ir multilayer. The PEL 130 may include B and Co and/or Fe as described above.

In addition, in the embodiment shown, the Co (i.e. magnetic material(s)) and Hf (i.e. high crystalline temperature material(s)) of the insertion layer 120B are provided such that they form a CoHf alloy layer 120B. As used herein, a CoHf alloy includes $Co_yHf_{(1-y)}$, where $0<y\leq0.7$. In some embodiments, this may include co-sputtering the Co and Hf at the desired rate(s) to obtain the stoichiometry of interest for the CoHf alloy insertion layer 120B. In other embodiments, the Co and Hf might be sputtered from a composite Co-Hf target. In some embodiments, a high power is used for at least the Hf to encourage intermixing. Thus, a high power of greater than two hundred Watts may be used. In some such embodiments, the power may be at least two hundred Watts. In other embodiments, the alloying of Co and Hf is sufficient and a high power of at least two hundred Watts is not necessary.

The structure, function and material(s) used for the remaining layers 110, 130, 140 and 150 are analogous to those used for the pinned layer 110, PEL 130, nonmagnetic spacer layer 140 and free layer 150 in the magnetic junctions 100A, 100A' and 100A". As discussed above, the order of the layers 110, 120B, 130, 140 and 150 with respect to the substrate 101 may be changed. An additional nonmagnetic spacer layer (not shown), an optional additional PEL, an optional additional insertion layer and an additional pinned layer may be added in some embodiments. Consequently, in alternate embodiments, the magnetic junction 100B might be a top-pinned magnetic junction or a dual magnetic junction.

The magnetic junction 100B may share the benefits of the magnetic junctions 100A, 100A' and/or 100A'. The magnetic junction 100B having the Co—Hf alloy insertion layer 120B may have improved performance despite the use of higher temperature anneals. For example, a sufficiently high exchange field, reduced BH and reduced WER may be preserved through anneal(s) at temperature(s) of at least four hundred degrees Celsius, at least four hundred fifty degrees Celsius and/or higher temperatures. Consequently, the magnetic junction 100B may be incorporated into an electronic device without its performance unduly adversely affected.

Figure 3:
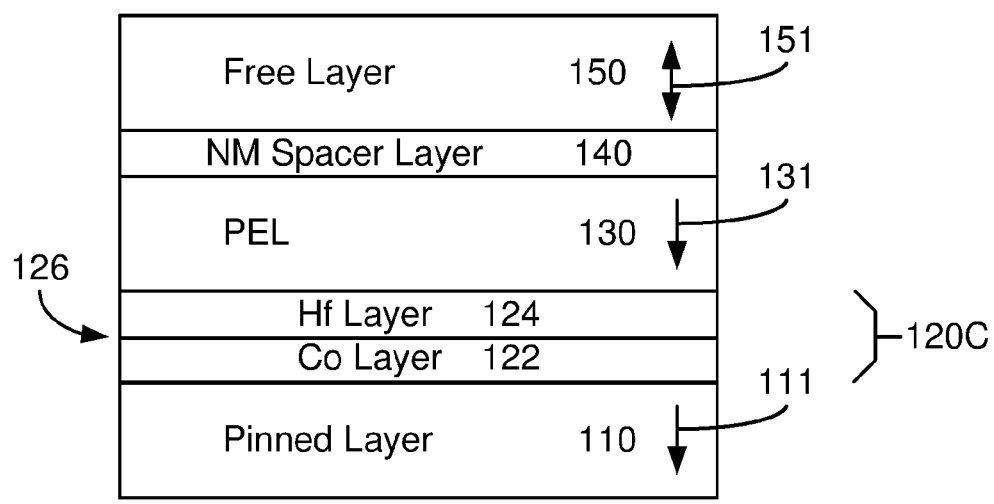
FIG. 3 depicts exemplary embodiments of another magnetic junction usable in a magnetic memory, programmable using spin transfer torque and including insertion layer including a high crystallization temperature constituent.

FIG. 3 depicts another exemplary embodiment of a magnetic junction 100C in magnetic devices such as a magnetic memory programmable using spin transfer torque. For clarity, FIG. 3 is not to scale and not all components may be shown. The magnetic junction 100C is analogous to the magnetic junctions 100A, 100A', 100A" and/or 100B. Consequently, similar components have analogous labels.

The magnetic junction 100C is a bottom pinned magnetic junction that includes pinned layer 110, insertion layer 120C, PEL 130, nonmagnetic spacer layer 140 and free layer 150 having magnetic moment 151 that are analogous to the pinned layer 110, insertion layer 120A/120B, PEL 130, nonmagnetic spacer layer 140 and free layer 150 having magnetic moment 151 in FIGS. 1A-1C and 2. Optional seed layer 102 and capping layer 104 as well as the substrate 101 are also shown.

The structure, function and material(s) used for the pinned layer 110, insertion layer 120C, PEL 130, nonmagnetic spacer layer 140 and free layer 150 in the magnetic junction 100C are analogous to those used for the reference layer 110, insertion layer 120A/120B, PEL 130, nonmagnetic spacer layer 140 and free layer 150 in the magnetic junctions 100A, 100A', 100A" and/or 100B. For example, the insertion layer 120C includes a high crystallization temperature material such as Hf and a magnetic material such as Co. Similarly, the pinned layer 110 may include Pt and/or Ir, for example in the form of a Co/Pt multilayer and/or a Co/Ir multilayer. The PEL 130 may include B and Co and/or Fe as described above.

In addition, in the embodiment shown, the Co (i.e. magnetic material(s)) and Hf (i.e. high crystalline temperature material(s)) in the insertion layer 120C are provided such that they form a bilayer 120C. The bilayer includes a Co layer 122 and a Hf layer 124. The Co layer 122 is deposited first and adjoins the pinned layer 110. In some embodiments, the Co layer 122 is at least five Angstroms thick and not more than ten Angstroms thick. If the top layer of the pinned layer 110 is a Co layer, the Co layer 122 may be thinner or omitted. In some embodiments, the thickness of the Hf layer 124 is at least one Angstrom and not more than five Angstroms. In some such embodiments, the Hf layer 124 is not more than four Angstroms thick. Around the interface between the layers 122 and 124, there may be a region 126 at which the Hf and Co may be intermixed. This intermixing may be due to a high power deposition of at least the Hf. In some embodiments, this intermixed region is greater than one monolayer but not exceed three monolayers. Thus, the intermixed region may be at least 1.5 Angstroms thick. Further, although a bilayer of Co and Hf is depicted and discussed, in another embodiment, more layers might be present. For example, a Co/Hf/Co trilayer, a Co/Hf/Co/Hf multilayer or other analogous multilayer might be used. In each of these cases, however, at least a bilayer is present. Thus, the bilayer only is discussed hereinafter.

The structure, function and material(s) used for the remaining layers 110, 130, 140 and 150 are analogous to those used for the pinned layer 110, PEL 130, nonmagnetic spacer layer 140 and free layer 150 in the magnetic junctions 100A, 100A', 100A" and 100B. As discussed above, the order of the layers 110, 120B, 130, 140 and 150 with respect to the substrate 101 may be changed. An additional nonmagnetic spacer layer (not shown), an optional additional PEL, an optional additional insertion layer and an additional pinned layer may be added in some embodiments. Consequently, in alternate embodiments, the magnetic junction 100C might be a top-pinned magnetic junction or a dual magnetic junction.

The magnetic junction 100C may share the benefits of the magnetic junctions 100A, 100A', 100A" and/or 100B. The magnetic junction 100C has the bilayer insertion layer 120C including a Co layer 122, a Hf layer 124 and an intermixed region 126. Therefore, the magnetic junction 100C may have improved performance despite the use of higher temperature anneals. For example, a sufficiently high exchange field, reduced BH and/or reduced WER may be preserved at at least ninety or ninety five percent of pre-anneal values through anneal(s) at temperature(s) of at least four hundred degrees Celsius, at least four hundred fifty degrees Celsius and/or higher temperatures. Consequently, the magnetic junction 100C may be incorporated into an electronic device with its performance substantially preserved.

Figure 4A:
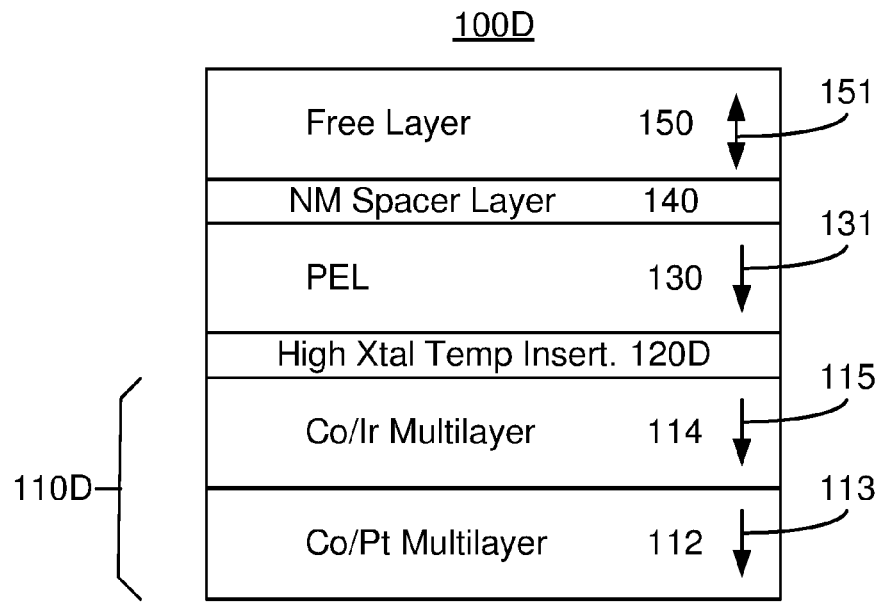
FIGS. 4A-4B depict exemplary embodiments of another magnetic junction usable in a magnetic memory, programmable using spin transfer torque and including at least one insertion layer including a high crystallization temperature constituent.
Figure 4B:
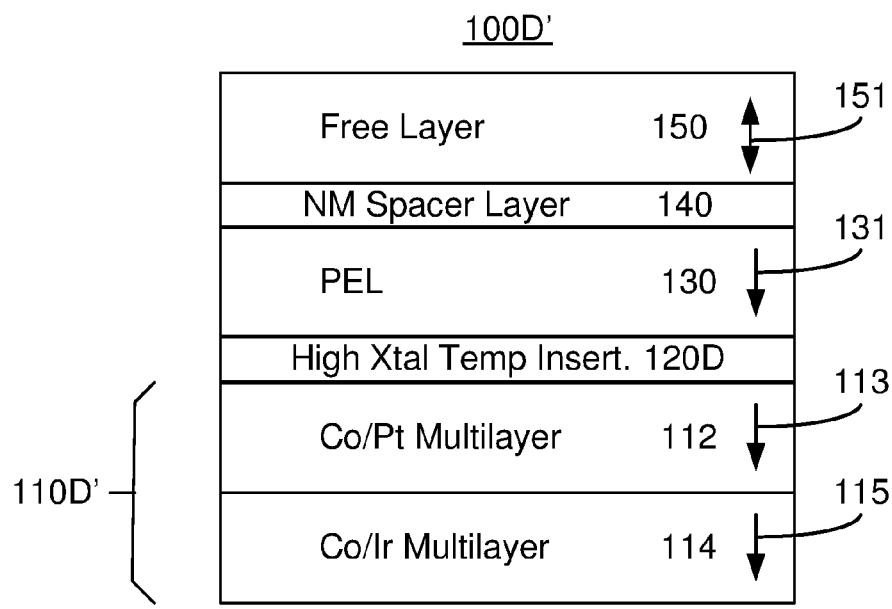

FIGS. 4A and 4B depict other exemplary embodiments of a magnetic junction 100D and 100D', respectively, in magnetic devices such as a magnetic memory programmable using spin transfer torque. For clarity, FIGS. 4A and 4B are not to scale and not all components may be shown. The magnetic junctions 100D and 100D' are analogous to the magnetic junctions 100A, 100A', 100A", 100B and/or 100C. Consequently, similar components have analogous labels.

Referring to FIG. 4A, the magnetic junction 100D is a bottom pinned magnetic junction that includes pinned layer 110D, insertion layer 120D, PEL 130, nonmagnetic spacer layer 140 and free layer 150 having magnetic moment 151 that are analogous to the pinned layer 110, insertion layer 120A/120B/120C, PEL 130, nonmagnetic spacer layer 140 and free layer 150 having magnetic moment 151 in FIGS. 1A-1C and 2-3. Optional seed layer 102 and capping layer 104 as well as the substrate 101 are also shown.

The structure, function and material(s) used for the pinned layer 110D, insertion layer 120D, PEL 130, nonmagnetic spacer layer 140 and free layer 150 in the magnetic junction 100D are analogous to those used for the reference layer 110, insertion layer 120A/120B/120C, PEL 130, nonmagnetic spacer layer 140 and free layer 150 in the magnetic junctions 100A, 100A', 100A", 100B and/or 100C. For example, the insertion layer 120D includes a high crystallization temperature material such as Hf and a magnetic material such as Co. In some embodiments, for example, the insertion layer 120D may be an alloy of Co and Hf. In other embodiments, the insertion layer 120D may be a bilayer. Such a bilayer may include an intermixed region between the Co and Hf layers. Similarly, the pinned layer 110 may include Pt and/or Ir. The PEL 130 may include B and Co and/or Fe as described above.

In the embodiment shown, the pinned layer 110D explicitly includes a Co/Pt multilayer 112 having perpendicular magnetic moment 113 and a Co/Ir multilayer 114 having a perpendicular magnetic moment 115. Thus, the multilayer 112 may include one or more repeats of a Co/Pt bilayer. The multilayer 114 may include one or more repeats of a Co/Ir multilayer. The top layer of the pinned layer 110D is, however, generally desired to be a Co layer. Consequently, the structure of the pinned layer 110D is such that the pinned layer has a high perpendicular magnetic anisotropy. In an alternate embodiment the Co/Pt multilayer 112 or the Co/Ir multilayer 114 might be omitted. Thus, the pinned layer 110D may consist of the Co/Pt multilayer 112 or may consist of the Co/Ir multilayer 114.

FIG. 4B depicts another embodiment of a magnetic junction 100D'. The magnetic junction 100D' is a bottom pinned magnetic junction that includes pinned layer 110D', insertion layer 120D, PEL 130, nonmagnetic spacer layer 140 and free layer 150 having magnetic moment 151 that are analogous to the pinned layer 110/110D, insertion layer 120A/120B/120C/120D, PEL 130, nonmagnetic spacer layer 140 and free layer 150 having magnetic moment 151 in FIGS. 1A-1C and 2-4A. Optional seed layer 102 and capping layer 104 as well as the substrate 101 are also shown.

In the magnetic junction 100D', the order of the layers 112 and 114 has been reversed. The Co/Pt multilayer 112 is closer to the insertion layer 120D in this embodiment. Otherwise, the magnetic junction 100D' is substantially the same as the magnetic junction 100D.

Referring to FIGS. 4A and 4B, the structure, function and material(s) used for the remaining layers 120D, 130, 140 and 150 are analogous to those used for the insertion layer 120A/120B/120C, PEL 130, nonmagnetic spacer layer 140 and free layer 150 in the magnetic junctions 100A, 100A', 100A", 100B and 100C. As discussed above, the order of the layers 110D/110D', 120D, 130, 140 and 150 with respect to the substrate 101 may be changed. An additional nonmagnetic spacer layer (not shown), an optional additional PEL, an optional additional insertion layer and an additional pinned layer may be added in some embodiments. Consequently, in alternate embodiments, the magnetic junction(s) 100D and/or 100D' might be a top-pinned magnetic junction or a dual magnetic junction.

The magnetic junctions 100D and 100D' may share the benefits of the magnetic junctions 100A, 100A', 100A", 100B and/or 100C. Therefore, the magnetic junctions 100D and 100D' may have improved performance despite the use of higher temperature anneals. For example, a sufficiently high exchange field, reduced BH and/or reduced WER may be preserved at at least ninety or ninety-five percent of pre-anneal values through anneal(s) at temperature(s) of at least four hundred degrees Celsius, at least four hundred fifty degrees Celsius and/or higher temperatures. Consequently, the magnetic junctions 100D and 100D' may be incorporated into an electronic device with its performance substantially preserved.

Figure 5:
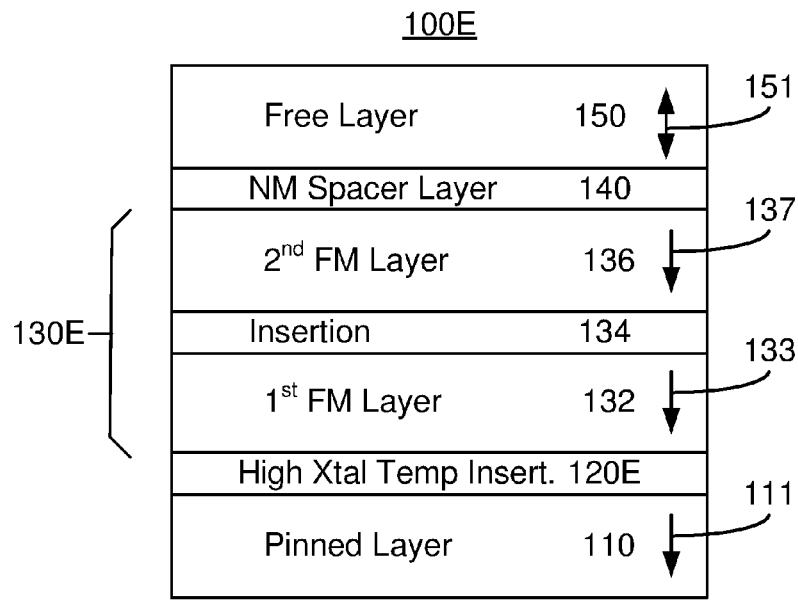
FIG. 5 depicts another exemplary embodiment of a magnetic junction usable in a magnetic memory, programmable using spin transfer torque and including at least one insertion layer including a high crystallization temperature constituent.

FIG. 5 depicts another exemplary embodiments of a magnetic junction 100E in magnetic devices such as a magnetic memory programmable using spin transfer torque. For clarity, FIG. 5 is not to scale and not all components may be shown. The magnetic junction 100E is analogous to the magnetic junctions 100A, 100A', 100A", 100B, 100C, 100D and/or 100D'. Consequently, similar components have analogous labels.

The magnetic junction 100E is a bottom pinned magnetic junction that includes pinned layer 110, insertion layer 120E, PEL 130E, nonmagnetic spacer layer 140 and free layer 150 having magnetic moment 151 that are analogous to the pinned layer 110/110D, insertion layer 120A/120B/120C/120D, PEL 130, nonmagnetic spacer layer 140 and free layer 150 having magnetic moment 151 in FIGS. 1A-1C and 2-4B. Optional seed layer 102 and capping layer 104 as well as the substrate 101 are also shown.

The structure, function and material(s) used for the pinned layer 110, insertion layer 120E, PEL 130E, nonmagnetic spacer layer 140 and free layer 150 in the magnetic junction 100E are analogous to those used for the reference layer 110/110D, insertion layer 120A/120B/120C/120D, PEL 130, nonmagnetic spacer layer 140 and free layer 150 in the magnetic junctions 100A, 100A', 100A" and/or 100B. For example, the insertion layer 120E includes a high crystallization temperature material such as Hf and a magnetic material such as Co. In some embodiments, for example, the insertion layer 120E may be an alloy of Co and Hf. In other embodiments, the insertion layer 120E may be a bilayer. Such a bilayer may include an intermixed region between the Co and Hf layers. Similarly, the pinned layer 110 may include Pt and/or Ir. For example, one or more of the multilayers 112 and 114 may be in the pinned layer 110.

The PEL 130E may include B and Co and/or Fe as described above. In addition, in the embodiment shown, the PEL 130E includes two ferromagnetic layers 132 and 136 separated by an additional insertion layer 134. The ferromagnetic layers 132 and 136 each has a high PMA that is greater than the out-of-plane demagnetization energy of the layers 132 and 136. Therefore, magnetic moments 133 and 137 that are stable perpendicular to plane. The ferromagnetic layer 132 may include B and at least one of Co and Fe. For example, the ferromagnetic layer 132 may include at least one of $(CoFe)_{(1-x)}B_x$ and $Fe_{(1-x)}B_x$, where $0.2 \leq x \leq 0.6$. In some embodiments, other stoichiometries may be supported. For example, x may be as low as 0.2 in some embodiments. In some embodiments, the upper ferromagnetic layer 136 may also include B and at least one of Co and Fe. In some embodiments, the stoichiometry ranges for the ferromagnetic layer 136 are substantially the same as for the ferromagnetic layer 132.

The insertion layer 134 between ferromagnetic layers 132 and 136 may be selected from Ta, W, Nb, Hf, Zr and Mo. In some embodiments, the thickness of the insertion layer 134 may be at least one Angstrom and not more than five Angstroms. In alternate embodiments, the insertion layer 134 may be substantially the same as the insertion layer 120E.

The structure, function and material(s) used for the remaining layers 110, 120E, 140 and 150 are analogous to those used for the pinned layer 110/110D, insertion layer 120A/120B/120C/120D, nonmagnetic spacer layer 140 and free layer 150 in the magnetic junctions 100A, 100A', 100A", 100B, 100C, 100D and/or 100D'. As discussed above, the order of the layers 110, 120E, 130E, 140 and 150 with respect to the substrate 101 may be changed. An additional nonmagnetic spacer layer (not shown), an optional additional PEL, an optional additional insertion layer and an additional pinned layer may be added in some embodiments. Consequently, in alternate embodiments, the magnetic junction 100E might be a top-pinned magnetic junction or a dual magnetic junction.

The magnetic junction 100E may share the benefits of the magnetic junctions 100A, 100A', 100A", 100B, 100C, 100D and/or 100D'. Therefore, the magnetic junction 100E may have improved performance despite the use of higher temperature anneals. For example, a sufficiently high exchange field, reduced BH and/or reduced WER may be preserved at at least ninety or ninety-five percent of pre-anneal values through anneal(s) at temperature(s) of at least four hundred degrees Celsius, at least four hundred fifty degrees Celsius and/or higher temperatures. Consequently, the magnetic junction 100E may be incorporated into an electronic device with its performance substantially preserved.

Figure 6:
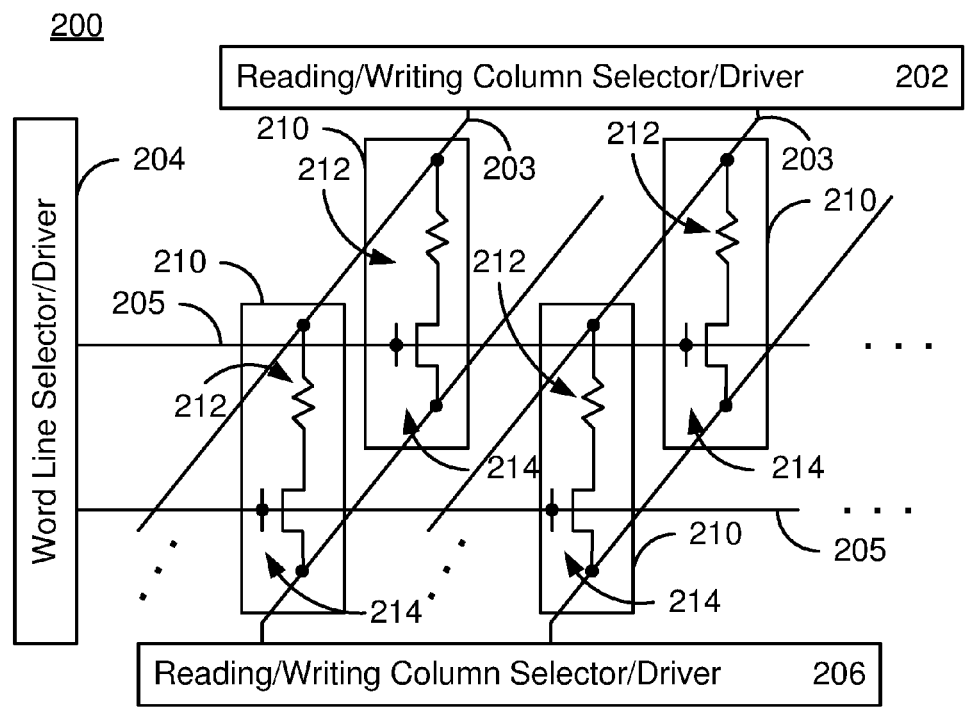
FIG. 6 depicts an exemplary embodiment of a memory utilizing magnetic junctions in the memory element(s) of the storage cell(s).

FIG. 6 depicts an exemplary embodiment of a memory 200 that may use one or more of the magnetic junctions 100A, 100A', 100A", 100B, 100C, 100D, 100D' and/or 100E and/or other magnetic junctions. The magnetic memory 200 includes reading/writing column select drivers 202 and 206 as well as word line select driver 204. Note that other and/or different components may be provided. The storage region of the memory 200 includes magnetic storage cells 210. Each magnetic storage cell includes at least one magnetic junction 212 and at least one selection device 214. In some embodiments, the selection device 214 is a transistor. The magnetic junctions 212 may be one of the 100A, 100A', 100A", 100B, 100C, 100D, 100D', 100E and/or other analogous magnetic junction(s). Although one magnetic junction 212 is shown per cell 210, in other embodiments, another number of magnetic junctions 212 may be provided per cell. Because the magnetic memory 200 includes one or more of the magnetic junctions 100A, 100A', 100A", 100B, 100C, 100D, 100D', 100E and/or an analogous magnetic junction, the magnetic memory 200 may enjoy the benefits described above.

Various features have been described with respect to the magnetic junctions 100A, 100A', 100A", 100B, 100C, 100D, 100D' and 100E and the magnetic memory 200. One of ordinary skill in the art will recognize that these features may be combined in manner(s) not shown and which are not inconsistent with the devices and methods described herein. For example, a magnetic junction might include a pinned layer 110D or 110D', an insertion layer 120B or 120C, a PEL 130E, a nonmagnetic spacer layer 140 that may be a crystalline MgO tunneling barrier layer and a free layer 150. In some embodiments, such a magnetic junction might also include an additional nonmagnetic spacer layer and an additional pinned layer. Further, an additional PEL and an additional insertion layer between the additional pinned layer and the additional nonmagnetic spacer layer might also be present. Thus, the magnetic junction in accordance with the methods, systems and devices described herein need not be explicitly depicted.

Figure 7:
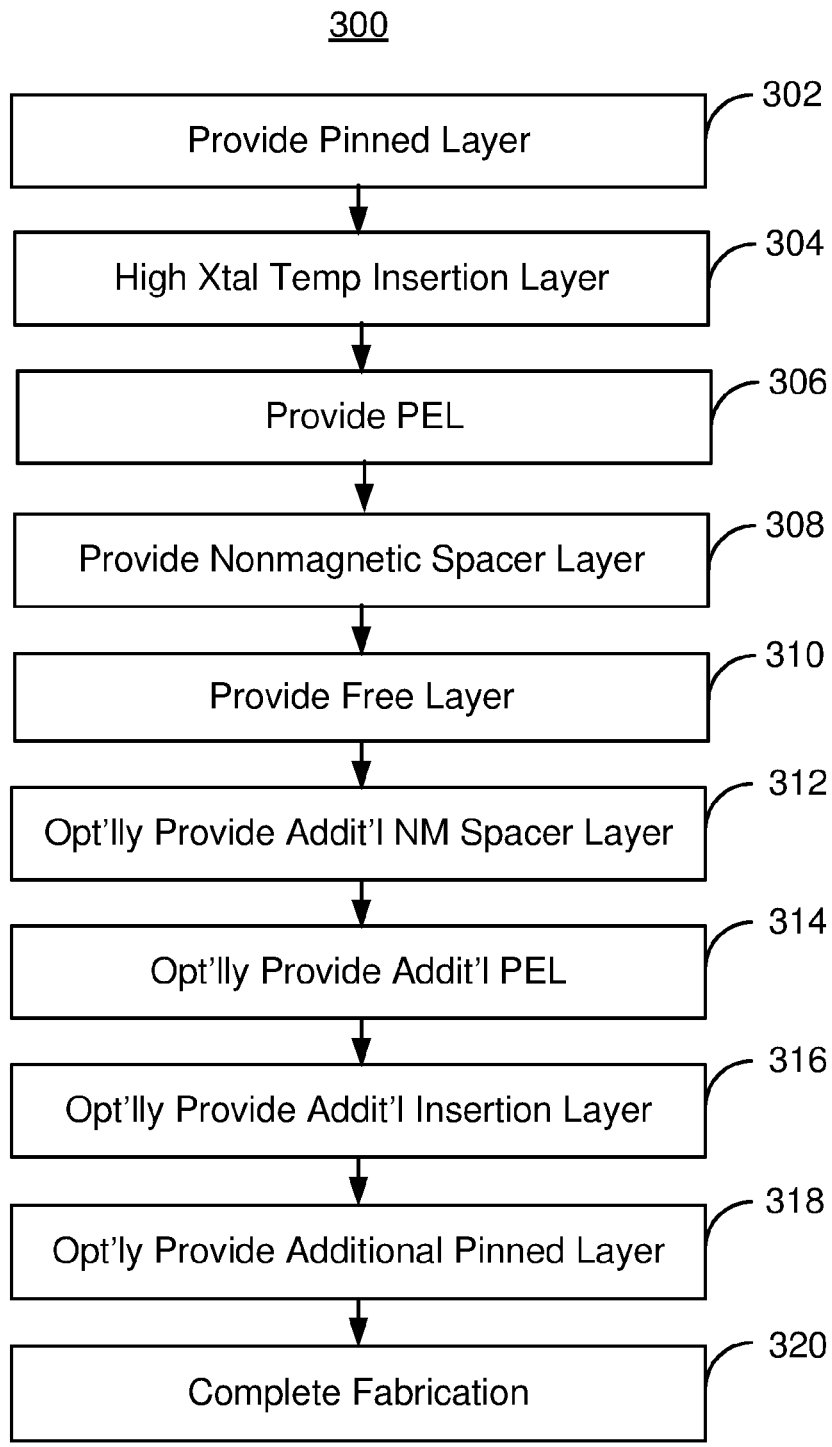
FIG. 7 is a flow chart depicting an exemplary embodiment of a method for providing a magnetic junction usable in a magnetic memory, programmable using spin transfer torque and including at least one insertion layer including a high crystallization temperature constituent.

FIG. 7 depicts an exemplary embodiment of a method 300 for fabricating a magnetic junction usable in a magnetic device such as a spin transfer torque random access memory (STT-RAM) and, therefore, in a variety of electronic devices. For simplicity, some steps may be omitted, performed in another order and/or combined. Further, the method 300 may start after other steps in forming a magnetic memory have been performed. The method 300 is also described in the context of forming a single magnetic junction. However, multiple magnetic junctions may be formed substantially simultaneously. The method 300 is also described in the context of the magnetic junction 100A". However, another magnetic junction such as the magnetic junction(s) 100A, 100A', 100B, 100C, 100D, 100D' and/or 100E might be formed.

The pinned layer 110 is provided, via step 302. The pinned layer 110 is magnetic and may have its magnetization pinned, or fixed, in a particular direction during at least a portion of the operation of the magnetic junction. The pinned layer 110 may include Co and at least one of Ir and Pt. The pinned layer formed in step 302 may be a single layer or a multilayer. The pinned layer formed in step 302 may have a perpendicular anisotropy energy that exceeds the out-of-plane demagnetization energy. Thus, the reference layer may have its magnetic moment oriented perpendicular to plane. For example, step 302 may include providing a Co/Pt multilayer, a Co/Ir multilayer or both multilayers.

Step 302 may include depositing the pinned layer on seed layer(s) 102. The seed layer(s) 102 may be selected for various purposes including but not limited to the desired crystal structure of the pinned layer, magnetic anisotropy and/or other magnetic characteristics of the pinned layer. For example, the pinned layer may be provided on a seed layer such as a (100) crystalline MgO layer that promotes a perpendicular magnetic anisotropy in the pinned layer. If a top pinned magnetic junction is formed, then step 302 may be omitted or the order of steps changed so that the free layer is closer to the substrate.

An insertion layer including at least one high crystallization temperature material is provided, via step 304. For example, the insertion layer 120A may be formed in step 304. The high crystallization temperature material(s) may be nonmagnetic, such as Hf. In some embodiments, step 304 also includes providing at least one magnetic material, such as Co. Also in step 304, the high crystallization temperature material(s) and magnetic material(s) are provided such that they at least partially intermix. For example, an alloy of the materials such as Co—Hf may be provided. In other embodiments, a Co/Hf bilayer may be formed. In such an embodiment, step 304 may include sputtering the Hf at a high power such that the Co and Hf intermix at and around the interface. For example, a power of at least two hundred watts may be used. In some embodiments, an anneal may be carried out after deposition of the insertion layer is completed. The insertion layer 120A may also be annealed as part of step 304.

A PEL is provided, via step 306. For example, the PEL 130 may be formed in step 306. The PEL may include high spin polarization materials and has a high PMA. For example, a $(CoFe)_{(1-x)}B_x$ layer and/or a $Fe_{(1-x)}B_x$ layer, where $0.2 \le x \le 0.6$, may be formed. In some embodiments, step 306 forms the PEL 130E.

A nonmagnetic spacer layer 140 is provided, via step 308. The nonmagnetic spacer layer 140 formed in step 308 may adjoin the PEL 130 or may be separated from the PEL by other layer(s). In some embodiments, a crystalline MgO tunneling barrier layer may be formed. Step 308 may include depositing MgO, which forms a tunneling barrier layer. In some embodiments, step 308 may include depositing MgO using, for example, radio frequency (RF) sputtering. Metallic Mg may be deposited, then oxidized in step 308 to provide a natural oxide of Mg. The MgO barrier layer/ nonmagnetic spacer layer may also be formed in another manner. Step 308 may include annealing the portion of the magnetic junction already formed to provide crystalline MgO tunneling barrier with a (100) orientation for enhanced tunneling magnetoresistance (TMR) of the magnetic junction.

The free layer 150 is provided, via step 310. Step 310 includes depositing the material(s) for the free layer. The free layer 150 provided in step 310 may be desired to have a perpendicular magnetic anisotropy that exceeds its demagnetization energy. The magnetic moment of the free layer may thus be stable out-of-plane, including perpendicular-to-plane. In addition, a PEL may be provided as part of or in addition to the free layer 150. The free layer 150 provided in step 310 is also configured to be switched between stable magnetic states when a write current is passed through the magnetic junction. Thus, the free layer 150 is switchable utilizing spin transfer torque. The free layer 150 provided in step 310 is magnetic and thermally stable at operating temperatures.

An additional nonmagnetic spacer layer 160 may optionally be provided, via step 312. Step 312 may be analogous to step 308. However, the thicknesses of the tunneling barrier layers are generally desired to be different.

An additional PEL 170 may optionally be provided, via step 314. The additional PEL 170 may be analogous to the PEL 130/130E. An additional insertion layer 180 may optionally be provided, via step 316. In some embodiments, step 316 may include depositing a layer of Ta, W, Nb, Hf, Zr and/or Mo. In other embodiments, an insertion layer such as the insertion layer 120A may be provided. An additional pinned layer 190 may optionally be provided, via step 318. Some or all of steps 312, 314, 316 and 318 may be carried out if a dual magnetic junction is desired. Fabrication of the device may be completed, via step 320. For example, the capping layer(s) 104 may be deposited and the edges of the magnetic junction defined, for example by providing a mask on the layers that have been deposited and ion milling the exposed portions of the layers. Note that although the layers are described as being provided, in some embodiments, steps 302, 304, 306, 308, 310, 312, 314, 316 and 318 include providing the layers in a magnetic junction stack. The edges of the junction may be defined after all layers in the magnetic junction have been deposited. Additional structures, such as contacts and conductive lines may also be formed for the device in which the magnetic junction is used. Fabrication of the magnetic junction may then be completed.

Using the method 300, a magnetic junction having improved performance despite the use of high temperature anneals may be provided. Thus, the method 300 may allow fabrication of a high perpendicular magnetic anisotropy, magnetically stable pinned layer and a magnetic junction having improved performance.

Figure 8:
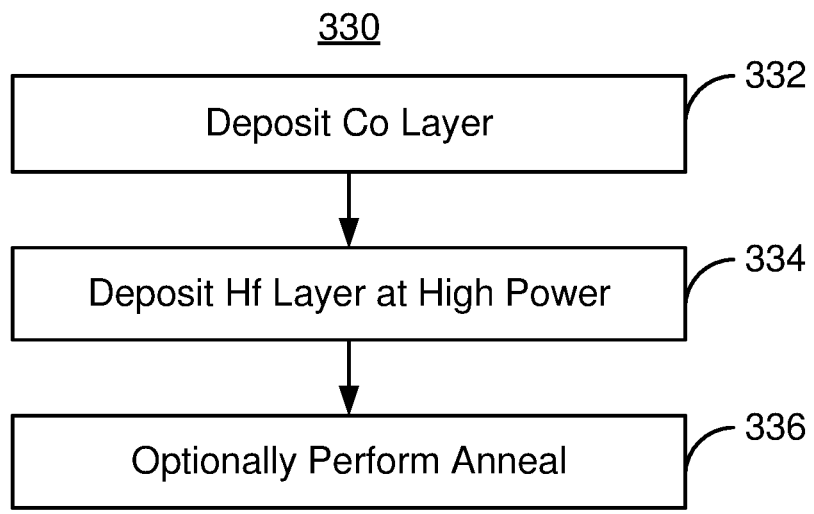
FIG. 8 is a flow chart depicting an exemplary embodiment of a method for providing an insertion layer including a high crystallization temperature constituent.

FIG. 8 is a flow chart depicting an exemplary embodiment of a method 330 for providing a portion of a magnetic junction usable in a magnetic device. More specifically, the method 330 is used in forming the insertion layer that includes high crystallization temperature material(s) is formed. For simplicity, some steps may be omitted, performed in another order, include substeps and/or combined. Although described in terms of a single magnetic junction, multiple magnetic junctions may be fabricated. For simplicity, the method is described in the context of the magnetic junction 100C. However, the method 330 may be used for any of the magnetic junctions 100A, 100A', 100A", 100B, 100D, 100D' and/or 100E.

A Co layer 122 for the insertion layer 120C is deposited, via step 332. Although described as part of the method 332, in some embodiments, the Co layer 122 provided in step 332 might also form the top layer of a Co/Pt multilayer used for the pinned layer 110. If the top layer of the pinned layer 110 is a Co layer, then a thinner Co layer may be deposited or step 332 may be omitted. At least one high crystallization temperature material that may be nonmagnetic is deposited, via step 334. Step 334 may include depositing Hf. Deposition of the Hf layer is performed in step 334 such that at least a portion of the Co and Hf intermix. In the embodiments shown, this is accomplished by depositing the Hf at a high power. For example, sputtering at a power of at least two hundred watts may be used. In another embodiment, another mechanism for intermixing may be used.

An anneal such as a rapid thermal anneal (RTA) may optionally be performed, via step 336. If performed, then such an RTA may be completed prior to deposition of a subsequent layer. In some embodiments, the RTA may be performed at a temperature that is greater than one hundred degrees Celsius and not more than four hundred and twenty-five degrees Celsius. The time for the RTA may be less than thirty minutes.

Using the method 330, an insertion layer that may improve the magnetic junction's ability to withstand higher temperature anneals is fabricated. Thus, the method 330 may allow fabrication of a magnetic junctions having improved pinned layer performance and which may be more readily incorporated into magnetic devices.

Figure 9:
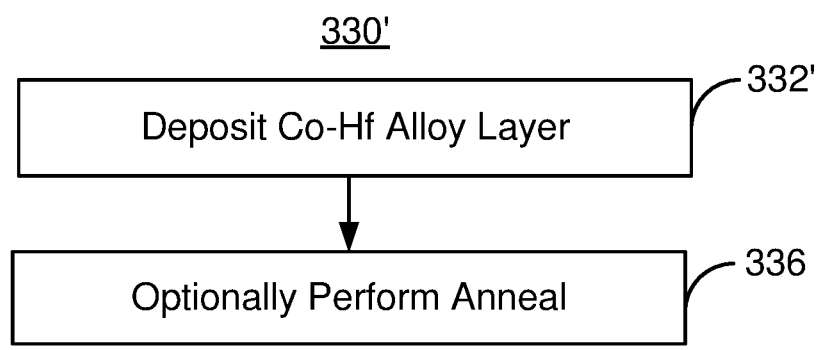
FIG. 9 is a flow chart depicting another exemplary embodiment of a method for providing an insertion layer including a high crystallization temperature constituent.

FIG. 9 is a flow chart depicting an exemplary embodiment of a method 330' for providing a portion of a magnetic junction usable in a magnetic device. More specifically, the method 330' is used in forming the insertion layer that includes high crystallization temperature material(s) is formed. For simplicity, some steps may be omitted, performed in another order, include substeps and/or combined. Although described in terms of a single magnetic junction, multiple magnetic junctions may be fabricated. For simplicity, the method is described in the context of the magnetic junction 1008. However, the method 330 may be used for any of the magnetic junctions 100A, 100A', 100A", 100C, 100D, 100D' and/or 100E.

An alloy insertion layer 1208 is deposited, via step 332'. High crystallization temperature nonmagnetic material(s) and magnetic material(s) are deposited in step 332'. Step 332' may include depositing Hf and Co. Deposition of the Hf and Co are performed to provide the desired stoichiometry in alloy layer 1208.

An anneal such as a RTA may optionally be performed, via step 336. Such an RTA may be performed prior to deposition of a subsequent layer.

Using the method 330', an insertion layer that may improve the magnetic junction's ability to withstand higher temperature anneals is fabricated. Thus, the method 330' may allow fabrication of a magnetic junctions having improved pinned layer performance and which may be more readily incorporated into magnetic devices.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device, the magnetic junction comprising: a pinned layer; an insertion layer including at least one magnetic material and at least one high crystallization temperature nonmagnetic material; a perpendicular enhancement layer (PEL) layer, the insertion layer being between the pinned layer and the PEL; a nonmagnetic spacer layer, the PEL being between the insertion layer and the nonmagnetic spacer layer; and a free layer, the free layer being switchable between a plurality of stable magnetic states when a write current is passed through the magnetic junction, the nonmagnetic spacer layer residing between the PEL and the free layer, each of the free layer, the PEL and the pinned layer having a perpendicular magnetic anisotropy energy and an out-of-plane demagnetization energy less than the perpendicular magnetic anisotropy energy.

2. The magnetic junction of claim 1 wherein the at least one magnetic material includes Co, the at least one high crystallization temperature nonmagnetic material includes Hf and the pinned layer includes at least one of Pt and Ir.

3. The magnetic junction of claim 2 wherein the insertion layer includes a layer selected from a bilayer and an alloy layer, the bilayer including a Co layer and a Hf layer, the Co layer being between the Hf layer and the pinned layer, the alloy layer including $Co_y Hf_{(1-y)}$, where $0 < y \leq 0.7$.

4. The magnetic junction of claim 3 wherein the Hf layer of the bilayer is at least one Angstrom thick and not more than five Angstroms thick and wherein the Co layer of the bilayer is at least four Angstroms thick and not more than ten Angstroms thick.

5. The magnetic junction of claim 2 wherein a portion of the insertion layer includes a Co—Hf intermixed region.

6. The magnetic junction of claim 1 wherein the pinned layer is selected from a first multilayer, a second multilayer and a third multilayer, the first multilayer including at least one Co/Pt bilayer, the second multilayer including at least one Co/Ir bilayer, the third multilayer including the first multilayer and the second multilayer closer to the insertion layer than the first multilayer.

7. The magnetic junction of claim 1 wherein the PEL includes at least one of $(CoFe)_{(1-x)}B_x$ and $Fe_{(1-x)}B_x$, where $0.2 \leq x \leq 0.6$.

8. The magnetic junction of claim 7 wherein the PEL includes a first ferromagnetic layer, an additional insertion layer and a second ferromagnetic layer, the first ferromagnetic layer being between the additional insertion layer and the insertion layer, the additional insertion layer being between the first and second ferromagnetic layers, the first ferromagnetic layer including the at least one of $(CoFe)_{(1-x)}B_x$ and $Fe_{(1-x)}B_x$.

9. The magnetic junction of claim 6 wherein the additional insertion layer includes at least one of Ta, W, Nb, Hf, Zr and Mo.

10. The magnetic junction of claim 2 wherein the nonmagnetic spacer layer includes a crystalline tunneling barrier layer.

11. The magnetic junction of claim 1 further comprising:
an additional nonmagnetic spacer; and an additional reference layer, the additional spacer layer being between the free layer and the additional reference layer such that the magnetic junction is a dual magnetic junction.

12. A magnetic memory residing on a substrate and comprising:
    a plurality of magnetic storage cells, each of the plurality of magnetic storage cells including a pinned layer, an insertion layer, a perpendicular enhancement layer (PEL), a nonmagnetic spacer layer and a free layer, the insertion layer including at least one magnetic material and at least one high crystallization temperature nonmagnetic material, the insertion layer being between the pinned layer and the PEL, the PEL being between the insertion layer and the nonmagnetic spacer layer, the free layer being switchable between a plurality of stable magnetic states when a write current is passed through the magnetic junction, the nonmagnetic spacer layer residing between the PEL and the free layer, each of the free layer, the PEL and the pinned layer having a perpendicular magnetic anisotropy energy and an out-of-plane demagnetization energy less than the perpendicular magnetic anisotropy energy; and
    a plurality of bit lines coupled with the plurality of magnetic storage cells.

13. A method for providing a magnetic junction usable in a magnetic device, the method comprising:
    providing a pinned layer;
    providing an insertion layer including at least one magnetic material and at least one high crystallization temperature nonmagnetic material;
    providing a perpendicular enhancement layer (PEL), the insertion layer being between the pinned layer and the PEL;
    providing a nonmagnetic spacer layer, the PEL being between the insertion layer and the nonmagnetic spacer layer; and
    providing a free layer, the free layer being switchable between a plurality of stable magnetic states when a write current is passed through the magnetic junction, the nonmagnetic spacer layer residing between the PEL and the free layer, each of the free layer, the PEL and the pinned layer having a perpendicular magnetic anisotropy energy and an out-of-plane demagnetization energy less than the perpendicular magnetic anisotropy energy.

14. The method of claim 13 wherein the at least one magnetic material includes Co, the at least one high crystallization temperature nonmagnetic material includes Hf and the pinned layer includes at least one of Pt and Ir, the step of providing the insertion layer further including:
    providing a layer selected from a bilayer and an alloy layer, the bilayer including a Co layer and a Hf layer, the Co layer being between the Hf layer and the pinned layer, the alloy layer including $Co_yHf_{(1-y)}$ where $0<y\leq0.7$.

15. The method of claim 14 wherein the step of providing the insertion layer includes sputtering Hf at a high power.

16. The method of claim 15 wherein the high power is at least two hundred Watts.

17. The method of claim 13 wherein the step of providing the insertion layer further includes performing an anneal at a temperature of at least three hundred fifty degrees Celsius after deposition of the insertion layer is completed.

18. The method of claim 13 wherein the pinned layer is selected from a first multilayer, a second multilayer and a third multilayer, the first multilayer including at least one Co/Pt bilayer, the second multilayer including at least one Co/Ir bilayer, the third multilayer including the first multilayer and the second multilayer closer to the insertion layer than the first multilayer.

19. The method of claim 13 wherein the PEL layer includes a first ferromagnetic layer, an additional insertion layer and a second ferromagnetic layer, the first ferromagnetic layer being between the additional insertion layer and the insertion layer, the additional insertion layer being between the first and second ferromagnetic layers, the first ferromagnetic layer including the at least one of $(CoFe)_{(1-x)}B_x$ and $Fe_{(1-x)}B_x$, the additional insertion layer including at least one of Ta, W, Nb, Hf, Zr and Mo, the second ferromagnetic layer between the additional insertion layer and the nonmagnetic spacer layer, the second ferromagnetic layer including $[(CoFe)_{(1-x)}B_x]_{(1-y)}Mo_y$, where $x\leq0.6$, $y\leq0.4$, and $y>0$.

20. The method of claim 13 further comprising:
    providing an additional nonmagnetic spacer; and
    providing an additional reference layer, the additional spacer layer being between the free layer and the additional reference layer such that the magnetic junction is a dual magnetic junction.

* * * * *